(12) United States Patent
Yang et al.

(10) Patent No.: US 12,218,164 B2
(45) Date of Patent: Feb. 4, 2025

(54) SEMICONDUCTOR IMAGE-SENSING STRUCTURE AND METHOD FOR FORMING THE SAME

(71) Applicant: TAIWAN SEMICONDUCTOR MANUFACTURING COMPANY LTD., Hsinchu (TW)

(72) Inventors: Ming-Hsien Yang, Taichung (TW); Wen-I Hsu, Tainan (TW); Kuan-Fu Lu, Kaohsiung (TW); Feng-Chi Hung, Hsin-Chu County (TW); Jen-Cheng Liu, Hsin-Chu (TW); Dun-Nian Yaung, Taipei (TW); Chun-Hao Chou, Tainan (TW); Kuo-Cheng Lee, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 557 days.

(21) Appl. No.: 17/587,262

(22) Filed: Jan. 28, 2022

(65) Prior Publication Data
US 2023/0275109 A1  Aug. 31, 2023

(51) Int. Cl.
*H01L 27/146* (2006.01)

(52) U.S. Cl.
CPC .. *H01L 27/14623* (2013.01); *H01L 27/14685* (2013.01); *H01L 27/14605* (2013.01); *H01L 27/14621* (2013.01); *H01L 27/14645* (2013.01)

(58) Field of Classification Search
CPC ......... H01L 27/14605; H01L 27/14621; H01L 27/14623; H01L 27/14645; H01L 27/14685
USPC .......................................................... 257/435
See application file for complete search history.

(56) References Cited

U.S. PATENT DOCUMENTS 8,866,250 B2 * 10/2014 Ting .................. H01L 27/14636
438/70

* cited by examiner

*Primary Examiner* — Monica D Harrison
(74) *Attorney, Agent, or Firm* — WPAT LAW; Anthony King

(57) ABSTRACT

A semiconductor image sensing structure includes a substrate having a first region and a second region, a metal grid in the first region, and a hybrid metal shield in the second region. The hybrid metal shield includes a first metallization layer, a second metallization layer disposed over the first metallization layer, a third metallization layer disposed over the second metallization layer, and a fourth metallization layer disposed over the third metallization layer. An included angle of the second metallization layer is between approximately 40° and approximately 60°.

20 Claims, 19 Drawing Sheets

SEMICONDUCTOR IMAGE-SENSING STRUCTURE AND METHOD FOR FORMING THE SAME

BACKGROUND

Semiconductor image sensors are used to sense radiation, such as light. Complementary metal-oxide-semiconductor (CMOS) image sensors (CIS) are widely used in various applications, such as digital cameras and mobile phone cameras. Such cameras utilize an array of pixels located in a substrate, including photodiodes and transistors that can absorb radiation projected toward the substrate and convert the sensed radiation into electrical signals.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
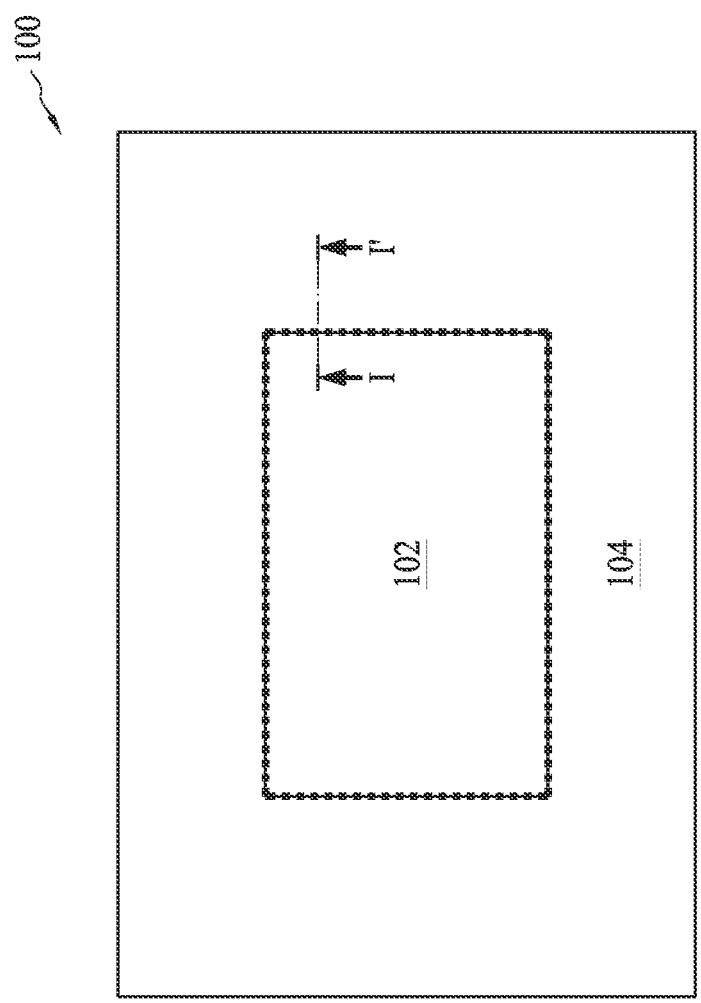
FIG. 1 shows a semiconductor image-sensing structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise Backside illumination (BSI) image sensors are replacing front-side illumination sensors for their greater efficiency in capturing photons. During formation of the BSI image sensors, the BSI image sensors and logic circuits are formed in a semiconductor substrate of a wafer (or silicon chip), followed by formation of an interconnect structure on a front side of the silicon chip.

Image-sensing elements of the BSI image sensors generate electrical signals in response to stimulation by photons. Magnitudes of the electrical signals (such as a photocurrent) depend on an intensity of an incident light received by the respective image sensors. The image-sensing elements, however, suffer from non-optically generated signals, which include leakage signals, thermally generated signals, dark currents, and other types of signals. Accordingly, the electrical signals generated by the image sensors need to be calibrated, so that the undesirable signals are cancelled from output signals of the image-sensing elements. To cancel the non-optically generated signals, black reference image-sensing elements are formed, and are used to generate non-optically generated signals. The black reference image-sensing elements, therefore, need to be blocked from receiving light signals.

The black reference image-sensing elements are covered by a metal shield, which is formed on a back side of the semiconductor substrate, in which the image-sensing elements are formed. It some comparative approaches, the metal shield and a metal grid, which serves as a portion of a low-n grid, may be formed simultaneously. The metal shield is required to be thick enough to block light. However, the metal grid with a thickness or height same as that of the metal shield may not be preferred because such metal grid reduces light intake.

The present disclosure therefore provides a semiconductor image-sensing structure having a metal shield and a metal grid with different thicknesses or heights. In some embodiments, the thickness of the metal shield is greater than the thickness of the metal grid. In some embodiments, the metal shield may be a hybrid metal shield. According to the semiconductor image-sensing structure, light is efficiently blocked from black reference image-sensing elements by the thick metal shield. Further, light intake may be increased by the thin metal grid.

Figure 2:
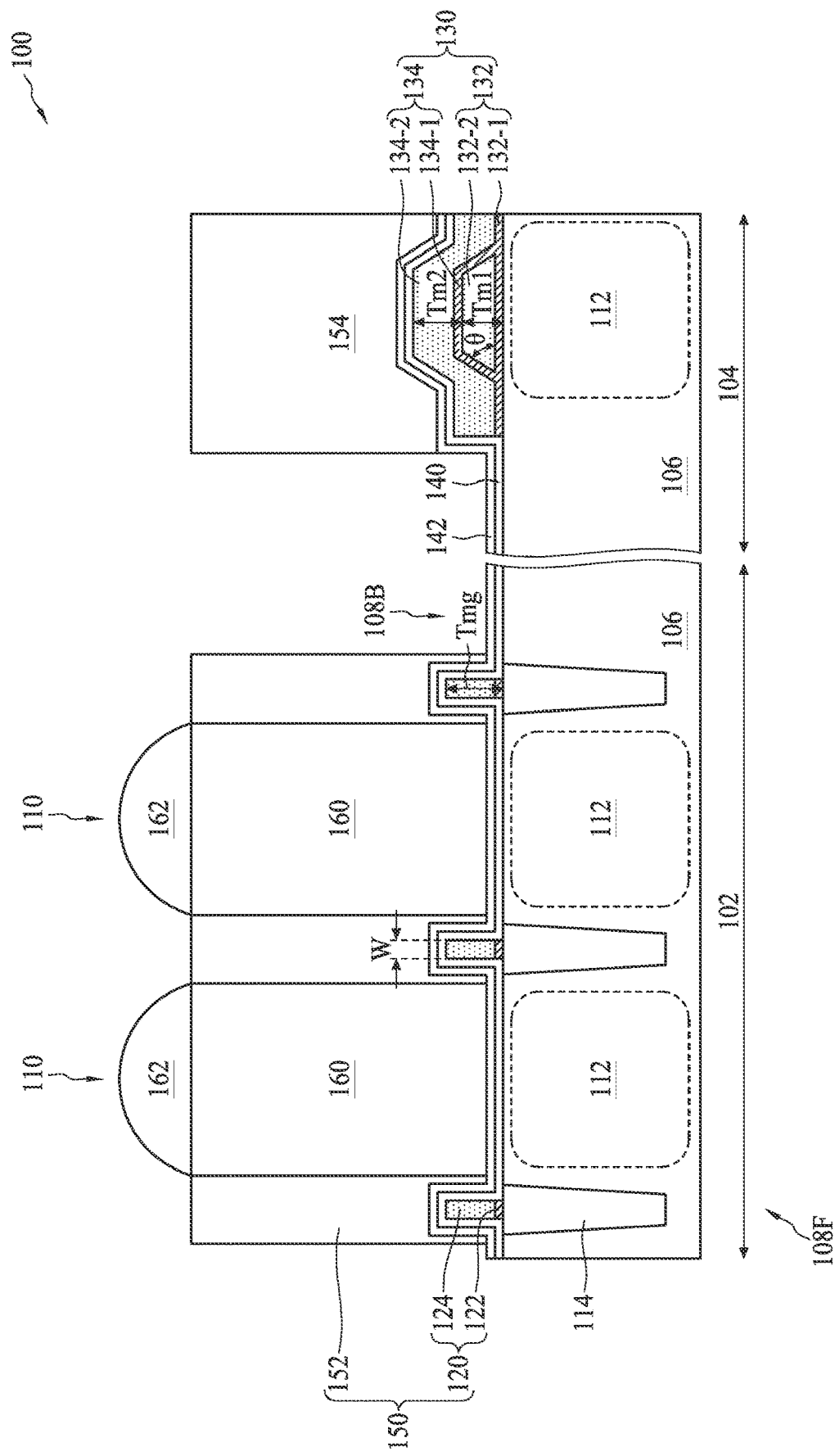
FIG. 2 is a cross-sectional view taken along line I-I' of FIG. 1 in accordance with some embodiments of the present disclosure.
Figure 3:
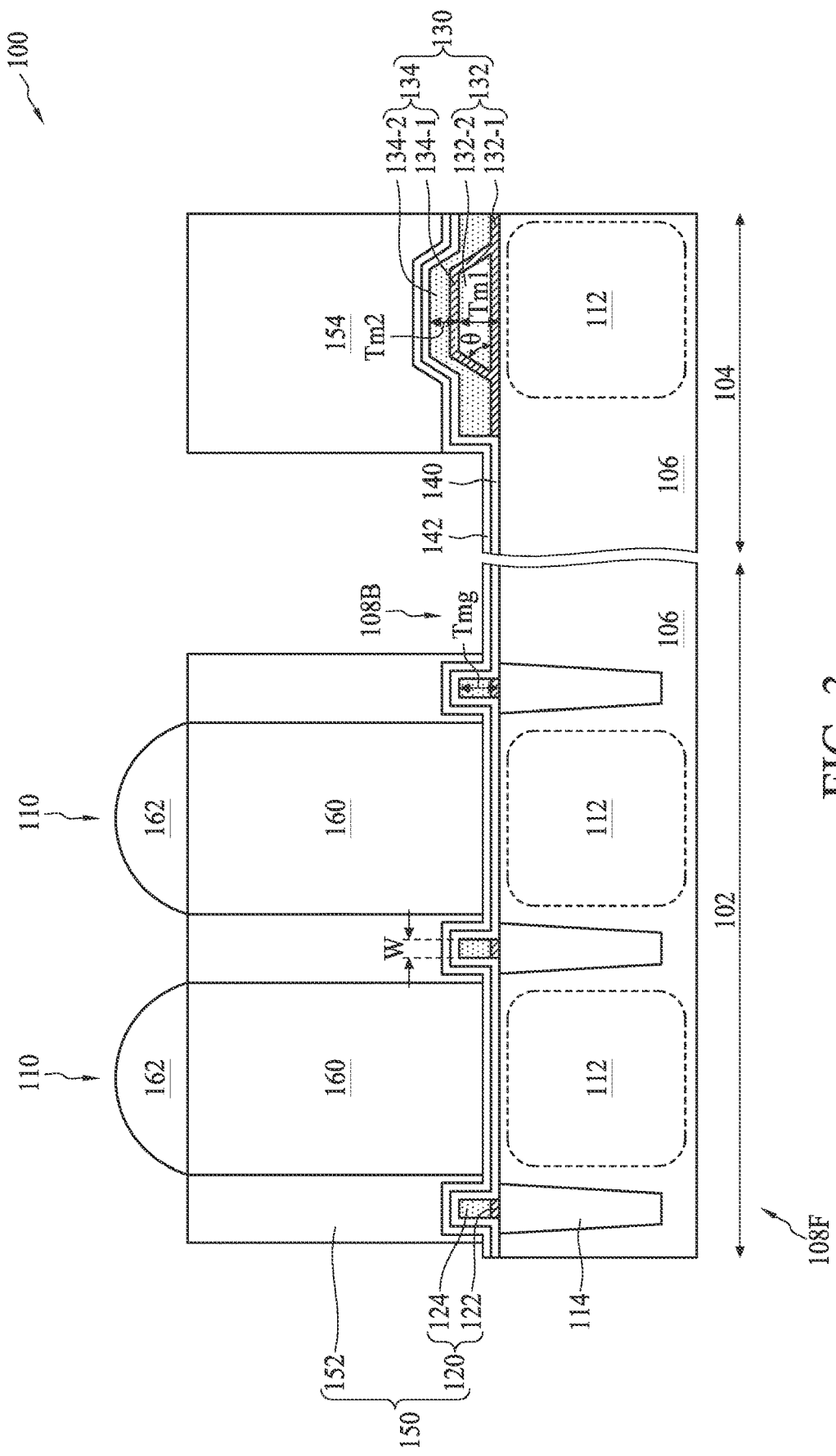
FIG. 3 is a cross-sectional view taken along line I-I' of FIG. 1 in accordance with some embodiments of the present disclosure.

Referring to FIGS. 1 to 3, wherein each of FIGS. 2 and 3 is a cross-sectional view taken along line I-I' of FIG. 1, a semiconductor image-sensing structure 100 may include a plurality of image-sensing elements 110 (e.g., pixels) arranged in a sensor region 102. In some embodiments, the semiconductor image-sensing structure 100 may be a CIS or active pixel sensor. In some embodiments, the semiconductor image-sensing structure 100 may be a charge-coupled device (CCD) or a passive pixel sensor. In some alternative embodiments, the semiconductor image-sensing structure 100 is a back-side illuminated (BSI) sensor device. The semiconductor image-sensing structure 100 includes the image-sensing elements 110 arranged in a sensor array for measuring an intensity or a brightness of radiation. In some embodiments, the image-sensing elements 110 may include photodiodes 112. In other embodiments, the image-sensing elements 110 may include pinned photodiodes. In some embodiments, photogate detectors, phototransistors, and/or other detectors known in the art may be used as the image-sensing elements 110. It should be understood that the semiconductor image-sensing structure 100 may include many hundreds or thousands of image-sensing elements 110 in the sensor region 102. In some embodiments, a black level calibration (BLC) region 104 is defined to surround the sensor region 102. For example, the BLC region 104 may have a frame-like configuration that surrounds the sensor region 102.

Please refer to FIGS. 1 to 3. The semiconductor image-sensing structure 100 includes a substrate 106. The substrate 106 has a front side 108F and a back side 108B opposite to the front side 108F. In some embodiments, the substrate 106 is a semiconductor substrate. The semiconductor substrate may be formed of a semiconductor material such as silicon, germanium, diamond or like materials. Compound materials used for semiconductor substrates such as silicon germanium, silicon carbide, gallium arsenide, indium arsenide, indium phosphide, or combinations of these may be used. In alternative embodiments, the semiconductor substrate 106 may include a silicon on insulator (SOI) substrate.

The image-sensing elements (i.e., pixels) 110 are formed at the back side 108B of the substrate 106. In some embodiments, the image-sensing element 110 includes the photodiode 112 configured to convert light signals (photons) to electrical signals, wherein the photodiodes 112 may be photo-sensitive MOS transistors or photo-sensitive diodes. In some exemplary embodiments, the photodiode 112 extends from the back side 108B into the substrate 106. Further, isolation structures 114 such as a deep trench isolation (DTI) may be formed to separate the photodiodes 112 from each other.

In some embodiments, the photodiode 112 may be formed in the BLC region 104, as shown in FIGS. 2 and 3. In contrast to the photodiode 112 in the sensor region 102, which is used for generating electrical signals from the sensed light, the photodiode 112 in the BLC region 104 serves as a black reference pixel, which is used for generating reference black level signals. The photodiodes 112 in the sensor region 102 and the BLC region 104 may be identical to each other, but the disclosure is not limited thereto.

A back-end-of-line (BEOL) interconnect structure (not shown) may be formed over the front side 108F of the substrate 106. The BEOL interconnect structure is used to electrically connect devices in the semiconductor image-sensing structure 100. In some embodiments, the BEOL interconnect structure includes dielectric layers, and metal line and via disposed in the dielectric layers.

Referring to FIGS. 2 and 3, the semiconductor image-sensing structure 100 includes a metal grid 120 disposed in the sensor region 102, and a hybrid metal shield 130 in the BLC region 104. In some embodiments, the hybrid metal shield 130 includes a first metal stack 132 and a second metal stack 134 over the first metal stack 132. In other words, the first metal stack 132 is disposed between the substrate 106 and the second metal stack 134.

In some embodiments, the first metal stack 132 includes a first metallization layer 132-1 and a second metallization layer 132-2 over the first metallization layer 132-1. In some embodiments, the first metallization layer 132-1 is in contact with the substrate 106, and the second metallization layer 132-2 is separated from the substrate 106 by the first metallization layer 132-1. The first metallization layer 132-1 includes a first material, and the second metallization layer 132-2 includes a second material different from the first material. For example, the first metallization layer 132-1 may include titanium nitride (TIN), and the second metallization layer 132-2 may include tungsten (W), but the disclosure is not limited thereto. In some embodiments, a thickness of the first metallization layer 132-1 is different from a thickness of the second metallization layer 132-2. Further, the thickness of the first metallization layer 132-1 is less than the thickness of the second metallization layer 132-2. In some embodiments, the thickness of the first metallization layer 132-1 is between approximately 100 angstroms and approximately 500 angstroms, but the disclosure is not limited thereto. In some embodiments, the thickness of the second metallization layer 132-2 is between approximately 100 angstroms and approximately 2.000 angstroms, but the disclosure is not limited thereto.

In some embodiments, the second metallization layer 132-2 of the hybrid metal shield 130 has an included angle θ, and the included angle θ is between approximately 40° and approximately 60°. In some embodiments, the second metallization layer 132-2 of the hybrid metal shield 130 is a trapezoid, as shown in FIGS. 2 and 3.

The second metal stack 134 is disposed over the first metal stack 132. The second metal stack 134 includes a third metallization layer 134-1 disposed over and in contact with the second metallization layer 132-2, and a fourth metallization layer 134-2 disposed over the third metallization layer 134-1. In some embodiments, the second metallization layer 132-2 of the first metal stack 132 is sealed within the first metallization layer 132-1 of the first metal stack 132 and the third metallization layer 134-1 of the second metal stack 134, as shown in FIGS. 2 and 3. Additionally, the fourth metallization layer 134-2 is separated from the first metallization layer 132-1 and the second metallization layer 132-2 by the third metallization layer 134-1. In some embodiments, the first metallization layer 132-1 of the first metal stack 132 and the third metallization layer 134-1 of the second metal stack 134 include the first material, and the second metallization layer 132-2 of the first metal stack 132 and the fourth metallization layer 134-2 of the second metal stack 134 include the second material different from the first material. In some embodiments, a thickness of the third metallization layer 134-1 is different from a thickness of the fourth metallization layer 134-2. Further, the thickness of the third metallization layer 134-1 is less than the thickness of the fourth metallization layer 134-2. In some embodiments, the thickness of the third metallization layer 134-1 is between approximately 100 angstroms and approximately 500 angstroms, but the disclosure is not limited thereto. In some embodiments, the thickness of the fourth metallization layer 134-2 is between approximately 100 angstroms and 2.000 angstroms, but the disclosure is not limited thereto.

Further, a thickness Tm1 of the first metal stack 132 is equal to a sum of the thickness of the first metallization layer 132-1 and the thickness of the second metallization layer 132-2, and a thickness Tm2 of the second metal stack 134 is equal to a sum of the thickness of the third metallization layer 134-1 and the thickness of the fourth metallization layer 134-2. In some embodiments, the thickness Tm1 of the first metal stack 132 and the thickness Tm2 of the second metal stack 134 are similar, as shown in FIG. 2.

The metal grid 120 is disposed in the sensor region 102. Further, the metal grid 120 may be aligned with the isolation structure 114, as shown in FIGS. 2 and 3. In some embodiments, a width W of the metal grid 120 may be equal to or less than a width of the isolation structure 114, but the disclosure is not limited thereto. In some embodiments, the width W of the metal grid 120 may between approximately 40 nanometers and approximately 60 nanometers, but the disclosure is not limited thereto The metal grid 120 includes a fifth metallization layer 122 and a sixth metallization layer 124 disposed over the fifth metallization layer 122. The fifth metallization layer 122 includes a material same as that of the third metallization layer 134-1 of the second metal stack 134, and the sixth metallization layer 124 includes a material same as that of the fourth metallization layer 134-2 of the second metal stack 134. In other words, the first metallization layer 132-1 of the first metal stack 132, the third metallization layer 134-1 of the second metal stack 134 and the fifth metallization layer 122 of the metal grid 120 include the same material, while the second metallization layer 132-2 of the first metal stack 132, the fourth metallization layer 134-2 of the second metal stack 134 and the sixth metallization layer 124 of the metal grid 120 include the same material.

In some embodiments, a thickness of the fifth metallization layer 122 is similar to the thickness of the third metallization layer 134-1 of the second metal stack 134, and a thickness of the sixth metallization layer 124 is similar to the thickness of the fourth metallization layer 134-2 of the second metal stack 134. Further, the thickness of the fifth metallization layer 122 is less than the thickness of the sixth metallization layer 124. A thickness Tmg of the metal grid 120 is equal to a sum of the thickness of the fifth metallization layer 122 and the thickness of the sixth metallization layer 124. Further, the thickness Tmg of the metal grid 120 is equal to the thickness Tm2 of the second metal stack 134. In some embodiments, the thickness Tmg of the metal grid 120, the thickness Tm2 of the second metal stack 134 and the thickness of Tm1 of the first metal stack 132 are similar, as shown in FIG. 2.

In other embodiments, the thickness Tmg of the metal grid 120, which is equal to the thickness Tm2 of the second metal stack 134, is less than the thickness Tm1 of the first metal stack 132. In other words, both the thickness Tmg of the metal grid 120 and the thickness Tm2 of the second metal stack 134 are less than the thickness Tm1 of the first metal stack 132, as shown in FIG. 3.

Still referring to FIGS. 2 and 3, in some embodiments, a protecting layer 140 and a protecting layer 142 are formed over the substrate 106 on the back side 108B. In some embodiments, the protecting layer 140 covers and is in contact with the metal grid 120, the substrate 106 and the hybrid metal shield 130. In some embodiments, the protecting layer 140 and the protecting layer 142 may include different materials. For example, the protecting layer 140 may include silicon oxide, and the protecting layer 142 may include aluminum oxide, silicon oxide with different optical property of n and k, and other dielectric films, but the disclosure is not limited thereto. In some embodiments, a thickness of the protecting layer 140 and a thickness of the protecting layer 142 may be different. For example, the thickness of the protecting layer 140 may be between approximately 250 angstroms and approximately 500 angstroms, while the thickness of the protecting layer 142 may be between approximately 20 angstroms and approximately 200 angstroms, but the disclosure is not limited thereto.

In some embodiments, the metal grid 120 is a part of a hybrid low-n grid 150. In such embodiments, the semiconductor image-sensing structure 100 further includes a dielectric grid 152 disposed in the sensor region 102 and a dielectric stack 154 in the BLC region 104. Further, the dielectric grid 152 overlaps the metal grid 120, and the dielectric stack 154 overlaps the hybrid metal shield 130. The dielectric grid 152 also aligns with and overlaps the isolation structure 114. In some embodiments, a width of the dielectric grid 152 is equal to or greater than the width of the isolation structure 114, but the disclosure is not limited thereto. Further, a top surface of the dielectric grid 152 in the sensor region 102 is aligned with a top surface of the dielectric stack 154 in the BLC region 104, but the disclosure is not limited thereto.

In some embodiments, a width of a bottom of the dielectric grid 152 and a width of a top of the dielectric grid 152 may be the same. In other embodiments, the width of the bottom of the dielectric grid 152 may be greater than the width of the top of the dielectric grid 152. Thus, the dielectric grid 152 may have a tapered sidewall, though not shown.

The semiconductor image-sensing structure 100 further includes a color filter 160 disposed over the substrate 106 on the back side 108B. Further, the color filter 160 is aligned with the photodiode 112, as shown in FIGS. 2 and 3. In some embodiments, sidewalls of the color filter 160 are in contact with the hybrid low-n grid 150 (i.e., the dielectric grid 152), and a bottom of the color filter 160 is in contact with the protecting layer 142. Further, a top surface of the color filter 160 is aligned with the top surface of the hybrid low-n grid 150 (i.e., the dielectric grid 152). The color filter 160 may have a refractive index that is less than a refractive index of the hybrid low-n grid 150. It will be appreciated that due to the different refractive indices of the color filter 160 and the hybrid low-n grid 150, when light, such as photons, encounter an interface between the color filter 160 and the hybrid low-n grid 150, the light is reflected away from the hybrid low-n grid 150 and back into the color filter 160, such that the light is not directed toward an incorrect photodiode 112.

The color filter 160 allows different specific colors or wavelengths of light to pass there through. For example, the color filter 160 may allow red light, or wavelengths corresponding to red light, to pass there through, while allowing substantially no other colors of light to pass therethrough. The color filter 160 may allow blue light, or wavelengths corresponding to blue light, to pass there through, while allowing substantially no other colors of light to pass therethrough. Or, the color filter 160 may allow green light, or wavelengths corresponding to green light, to pass there through, while allowing substantially no other colors of light to pass therethrough. In some embodiments, other colors of light may be allowed to exclusively pass through the color filter 160, but the disclosure is not limited thereto.

The semiconductor image-sensing structure 100 further includes a micro-lens 162 disposed over the color filter 160. The micro-lens 162 is configured to focus light toward the photodiode 112.

Referring to FIGS. 2 and 3, the thickness Tmg of the metal grid 120 may be equal to or less than the thickness Tm1 of the first metal stack 132, and the thickness Tmg of the metal grid 120 is less than a sum of the thickness Tm1 of the first metal stack 132 and the thickness Tm2 of the second metal stack 134. In other words, the thickness Tmg of the metal grid 120 is less than a thickness of the hybrid metal shield 130, as shown in FIGS. 2 and 3. Accordingly, the hybrid metal shield 130 is thick enough to block the light from entering the photodiode 112 in the BLC region 104. In contrast to the hybrid metal shield 130, the metal grid 120 in the sensor region 102 is relatively thin. Thus, light intake is impervious to the thickness Tmg of the metal grid 120 when the thickness Tmg of the metal grid 120 is equal to the thickness Tm1 of the first metal stack 132. In some embodiments, when the thickness Tmg of the metal grid 120 is less than the thickness Tm1 of the first metal stack 132, the light intake is improved.

Figure 4:
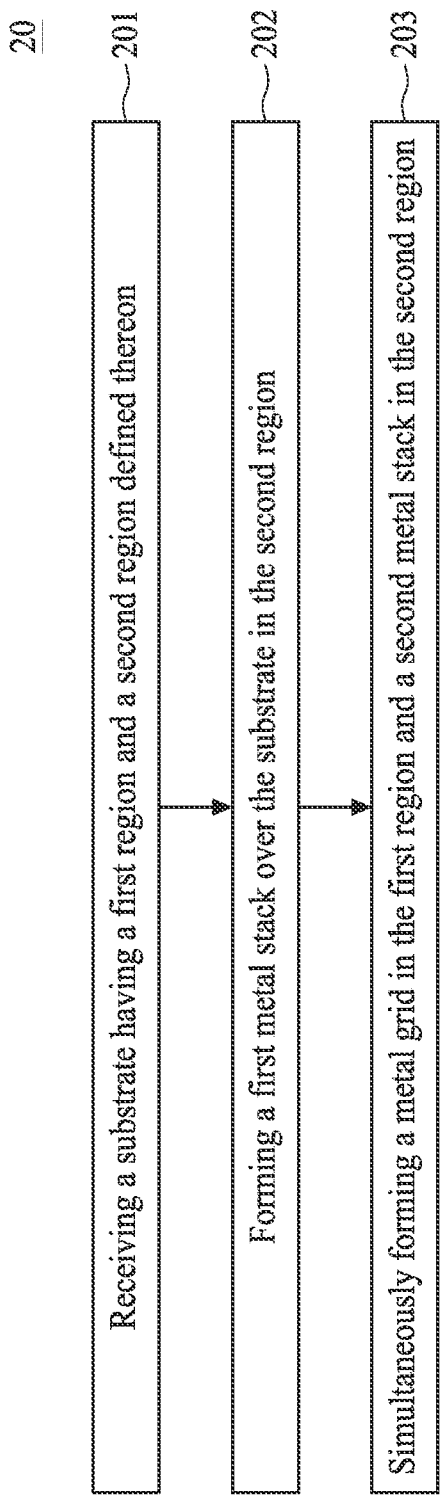
FIG. 4 shows a flowchart representing a method for forming a semiconductor image-sensing structure in accordance with some embodiments of the present disclosure.

Please refer to FIG. 4, which shows a flowchart representing a method 20 for forming a semiconductor image-sensing structure in accordance with some embodiments of the present disclosure. In the present disclosure, a method of manufacturing a semiconductor image-sensing structure is also disclosed. In some embodiments, a semiconductor structure is formed by the method 20. The method 20 includes a number of operations (201, 202 and 203) and the description and illustration are not deemed as a limitation to the sequence of the operations. The method 20 will be further described according to one or more embodiments. It should be noted that the operations of the method 20 may be rearranged or otherwise modified within the scope of the various aspects. It should be further noted that additional processes may be provided before, during, and after the method 20, and that some other processes may be only briefly described herein. Thus, other implementations are possible within the scope of the various aspects described herein.

Please also refer to FIGS. 5A to 5H, which are schematic drawings of a semiconductor image-sensing structure in various stages according to aspects of the present disclosure in one or more embodiments. In operation 201, a substrate 106 is received. Materials of the substrate 106 may be similar to those described above; therefore, repeated description is omitted. The substrate 106 has a front side 108F and a back side 108B opposite to the front side 108F. A sensor region 102 and a BLC region 104 are defined in the substrate 106. In some embodiments, front-end-of-line (FEOL) operations are performed on the front side 108F of the substrate 106 to form a plurality of doped regions (not shown), a plurality of photo-sensing regions (i.e., photodiodes 112), transistors (i.e., transfer transistor, readout transistor, source follower transistor and selector transistor) (not shown), and other suitable devices. Subsequently, middle-end-of-line (MEOL) operations are performed on the front side 108F of the substrate 106 to form conductive vias electrically connected to the doped regions, transistors and the devices. Back-end-of-line (BEOL) operations are performed on the front side 108F of the substrate 106 to form a BEOL interconnection structure (not shown) electrically connected to the doped regions, the transistors and/or the devices through the conductive vias.

Figure 5A:
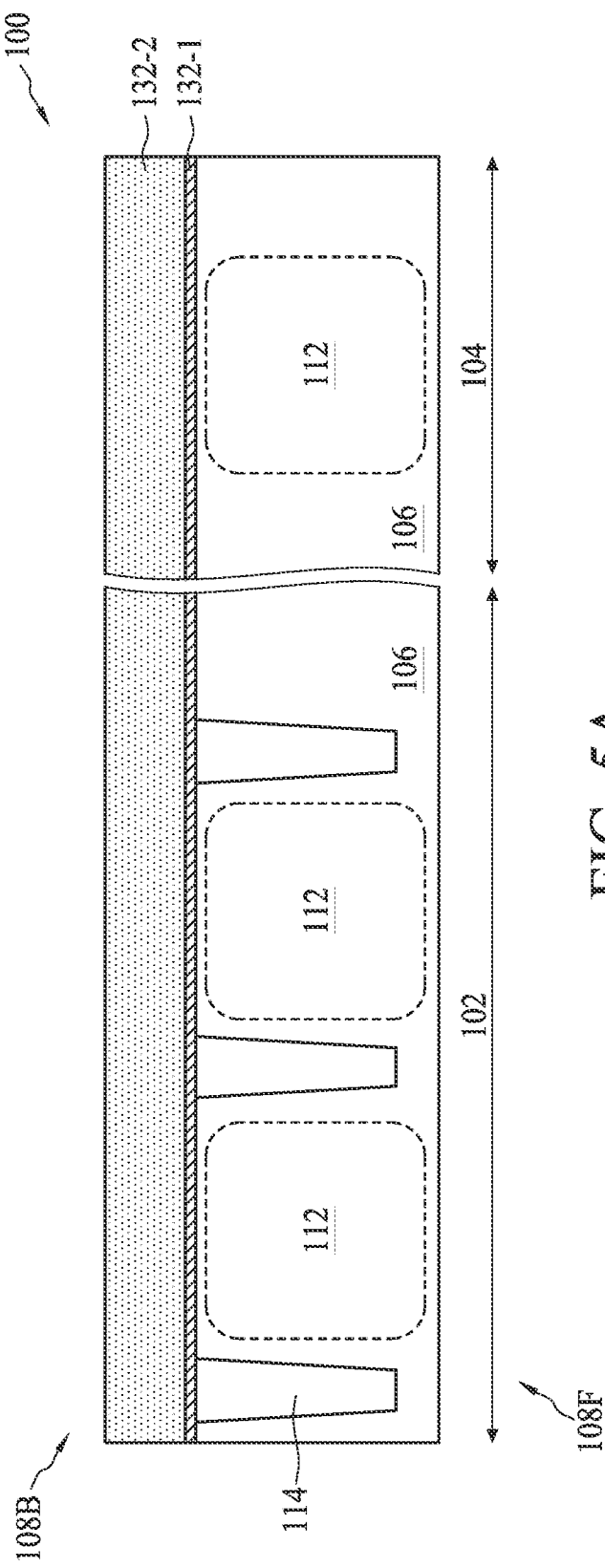
FIGS. 5A to 5H are schematic drawings illustrating a semiconductor image-sensing structure in various stages according to aspects of the present disclosure in one or more embodiments.

Still referring to FIG. 5A, in some embodiments, the substrate 106 is flipped over and thinned from the back side 108B. A plurality of isolation structures (i.e., DTI) 114 are formed in the substrate 106. Additionally, an anti-reflective coating (ARC) (not shown) may be formed over the surface of the substrate 106 on the back side 108B. The ARC is used to inhibit light from being reflected away from the photodiodes 112 so that the light reaches the photodiodes 112. In some embodiments, other suitable layers may be formed over the ARC: description of such those details is omitted for brevity.

Figure 5B:
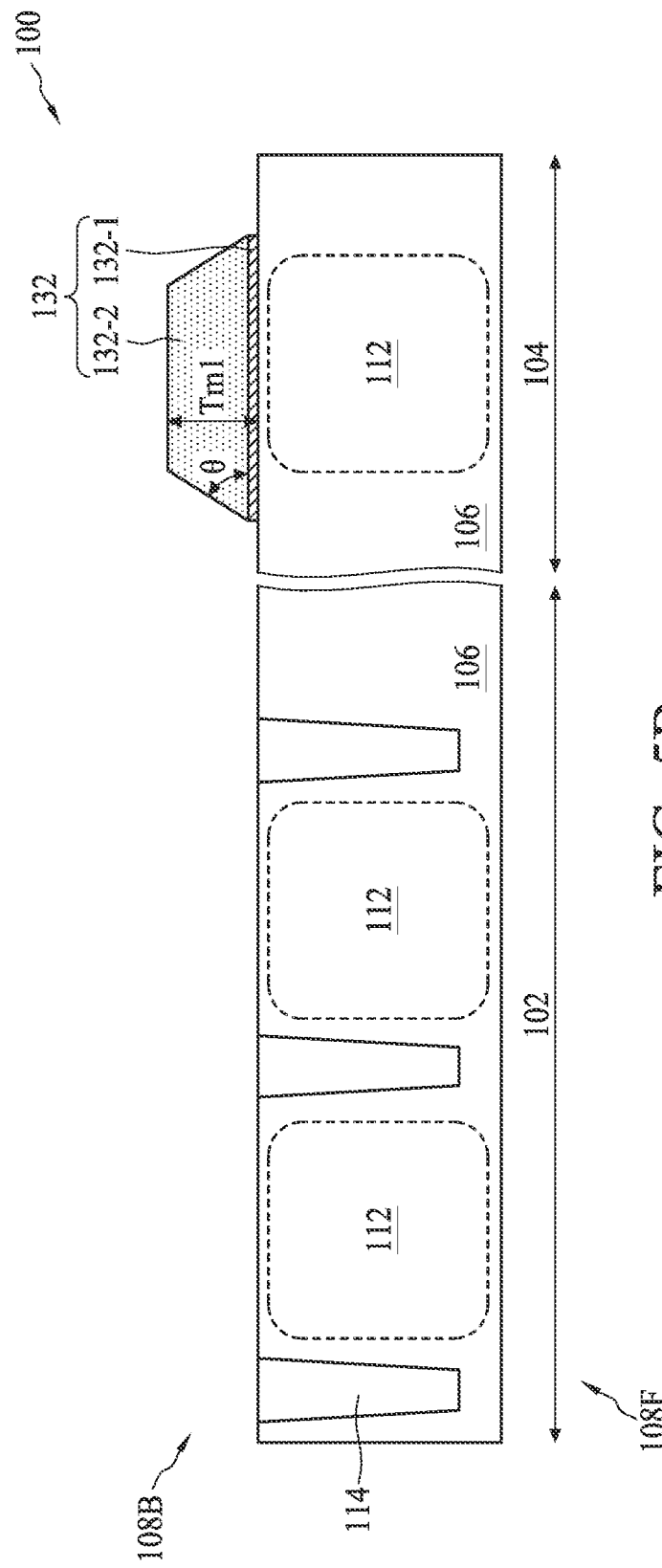

Referring to FIGS. 5A and 5B, in operation 202, a first metal stack 132 is formed over the substrate 106 on the back side 108B in the BLC region 104. The operation 202 includes further steps. For example, as shown in FIG. 5A, in some embodiments, a first metallization layer 132-1 is formed over the substrate 106 on the back side 108B. In some embodiments, the first metallization layer 132-1 includes TiN, but the disclosure is not limited thereto. In such embodiments, the first metallization layer 132-1 provides adhesion between the substrate 106 and its overlying layer. In some embodiments, a thickness of the first metallization layer 132-1 is between approximately 100 angstroms and approximately 500 angstroms, but the disclosure is not limited thereto.

In some embodiments, a second metallization layer 132-2 is formed over the first metallization layer 132-1. The second metallization layer 132-2 may include tungsten, but the disclosure is not limited thereto. A thickness of the second metallization layer 132-2 is different from the thickness of the first metallization layer 132-1. In some embodiments, the thickness of the second metallization layer 132-2 is greater than the thickness of the first metallization layer 132-1. In some embodiments, the thickness of the second metallization layer 132-2 is between approximately 100 angstroms and approximately 2,000 angstroms, but the disclosure is not limited thereto.

Referring to FIG. 5B, in some embodiments, the first and second metallization layers 132-1 and 132-2 are etched through a patterned hard mask (not shown). Thus, portions of the first metallization layer 132-1 and portions of the second metallization layer 132-2 are removed from the sensor region 102, and the first metal stack 132 is formed in the BLC region 104. In some embodiments, the first metal stack 132 has an included angle θ between approximately 10° and approximately 80°. In some embodiments, the sensor region 102 is free of the first and second metallization layers 132-1 and 132-2, as shown in FIG. 5B. Further, the second metallization layer 132-2 of the first metal stack 132 is a trapezoid, but the disclosure is not limited thereto. A thickness Tm1 of the first metal stack 132 is equal to a sum of the thickness of the first metallization layer 132-1 and the thickness of the second metallization layer 132-2.

It should be noted that because the second metallization layer 132-2 has the included angle, it has a slanted sidewall. During the forming of the third and fourth metallization layers 134-1 and 134-2, a void issue may be mitigated due to the slanted sidewall. In some comparative approaches, the void may be formed within a corner when the first metal stack 132 has a vertical sidewall. Further, other voids may be formed in layers overlying the first metal stack 132, and contaminations may be generated during the operations. In contrast to the comparative approaches, the slanted sidewall of the first metal stack 132 (i.e., the second metallization layer 132-2) of the present disclosure mitigates the void issue, and thus the contamination is reduced.

Figure 5C:
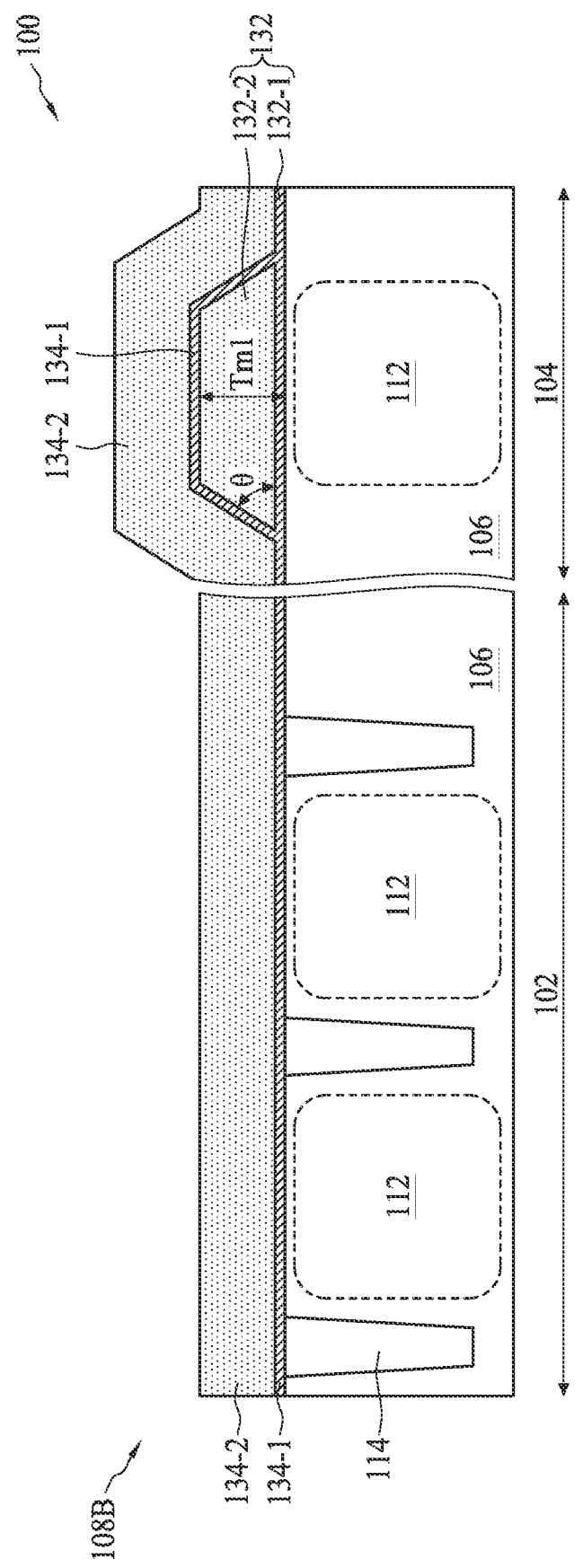

In operation 203, a metal grid 120 is formed in the sensor region 102 and a second metal stack 134 is formed in the BLC region 104, simultaneously. The operation 203 includes further steps. For example, in some embodiments, a third metallization layer 134-1 is formed over the substrate 106 on the back side 108B of the substrate 106. In some embodiments, the third metallization layer 134-1 includes a material same as that of the first metallization layer 132-1, but the disclosure is not limited thereto. As shown in FIG. 5C, the third metallization layer 134-1 covers the surface of the substrate 106 on the back side 108F and the first metal stack 132. In such embodiments, the second metallization layer 132-2 is sealed within the first and third metallization layers 132-1 and 134-1. The third metallization layer 134-1 provides adhesion between the substrate 106 and its overlying layer, and between the second metallization layer 132-2 and its overlying layer. In some embodiments, a thickness of the third metallization layer 134-1 may be similar to the thickness of the first metallization layer 132-1, as shown in FIG. 5C, but the disclosure is not limited thereto. For example, the thickness of the third metallization layer 134-1 may be less than the thickness of the first metallization layer 132-1.

Still referring to FIG. 5C, a fourth metallization layer 134-2 is formed over the third metallization layer 134-1. In some embodiments, the fourth metallization layer 134-2 includes a material same as that of the second metallization layer 132-2, but the disclosure is not limited thereto. A thickness of the fourth metallization layer 134-2 is different from the thickness of the third metallization layer 134-1. In some embodiments, the thickness of the fourth metallization layer 134-2 is greater than the thickness of the third metallization layer 134-1. Further, in some embodiments, the thickness of the fourth metallization layer 134-2 is similar to the thickness of the second metallization layer 132-2, as shown in FIG. 5C.

Figure 5D:
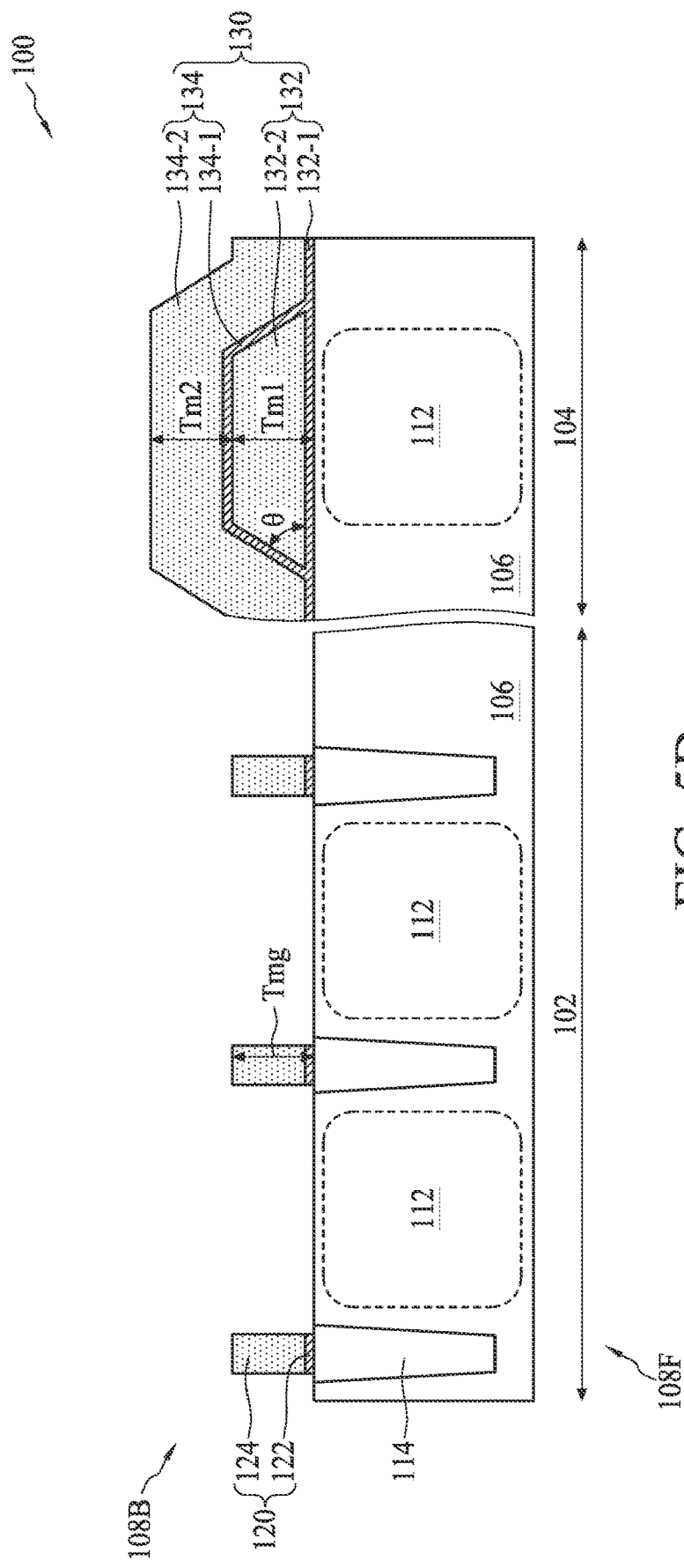

Referring to FIG. 5D, in some embodiments, the third and fourth metallization layers 134-1 and 134-2 are etched through a patterned hard mask (not shown). Thus portions of the third metallization layer 134-1 and portions of the fourth metallization layer 134-2 are removed from the sensor region 102 and the BLC region 104. Accordingly, the metal grid 120 is formed in the sensor region 102, and the second metal stack 134 is formed over the first metal stack 132 in the BLC region 104.

In some embodiments, remaining portions of the third and fourth metallization layers in the sensor region 102 serve as parts of the metal grid 120, and thus may be referred to as a fifth metallization layer 122 and a sixth metallization layer 124. The first metal stack 132 and the second metal stack 134 form a hybrid metal shield 130, as shown in FIG. 5D.

A thickness Tm2 of the second metal stack 134 is equal to a sum of a thickness of the third metallization layer 134-1 and a thickness of the fourth metallization layer 134-2, and a thickness Tmg of the metal grid 120 is equal to a sum of a thickness of the fifth metallization layer 122 and a thickness of the sixth metallization layer 124. As shown in FIG. 5D, in some embodiments, the thicknesses of the first metallization layer 132-1, the third metallization layer 134-1 and the fifth metallization layer 122 are the same, while the thicknesses of the second metallization layer 132-2, the fourth metallization layer 134-2 and the sixth metallization layer 124 are the same. In such embodiments, the thickness Tmg of the metal grid 120 is similar to the thickness Tm2 of the second metal stack 134, and the thickness Tmg of the metal grid 120 is also similar to the thickness Tm1 of the first metal stack 132.

Figure 5E:
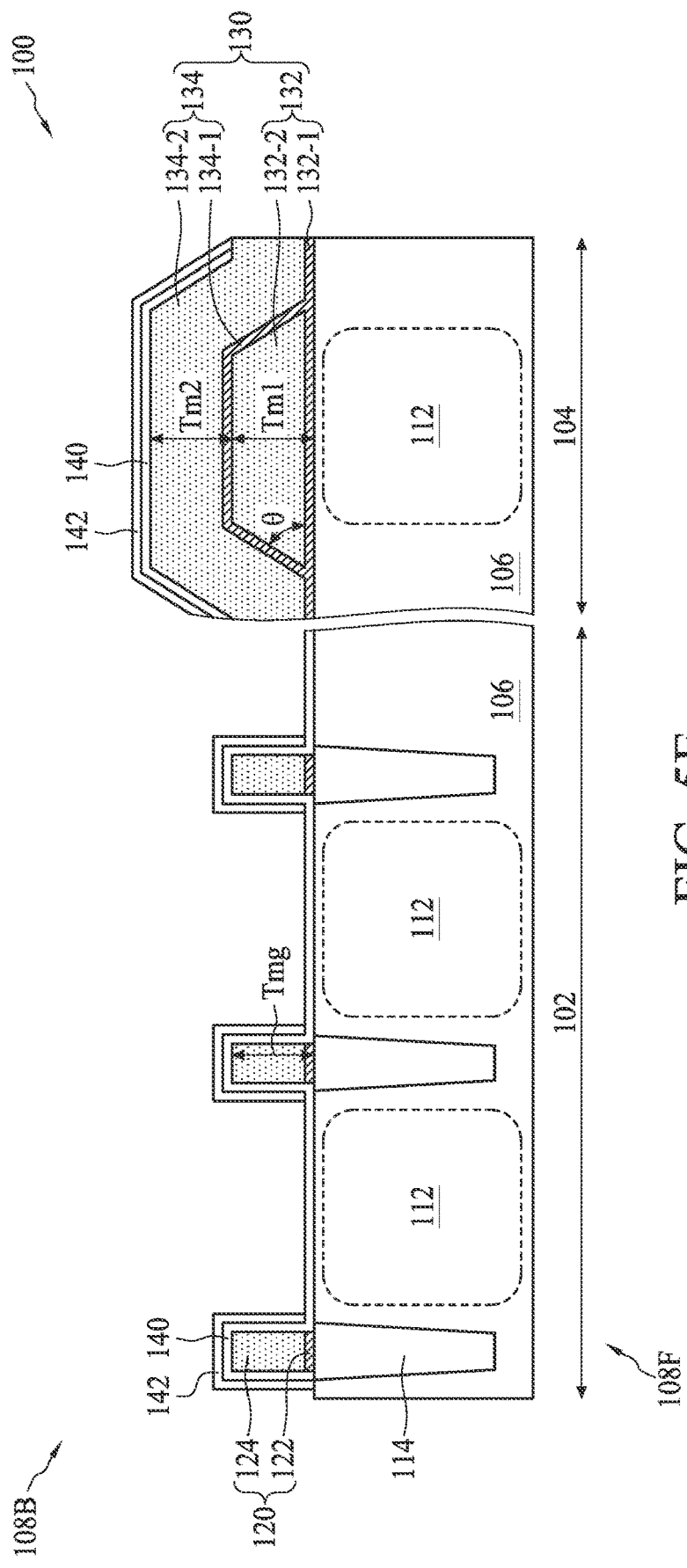

Referring to FIG. 5E, in some embodiments, protecting layers 140 and 142 may be formed over the substrate 106 on the back side 108B. The protecting layer 140 covers the metal grid 120, the surface of the substrate 106 on the back side 108b, and the hybrid metal shield 130, and the protecting layer 142 covers the protecting layer 140. The protecting layers 140 and 142 may include different materials. For example, the protecting layer 140 may include silicon oxide, and the protecting layer 142 may include aluminum oxide, but the disclosure is not limited thereto. A thickness of the protecting layer 140 may be different from a thickness of the protecting layer 142. In some embodiments, the thickness of the protecting layer 140 may be greater than the thickness of the protecting layer 142.

Figure 5F:
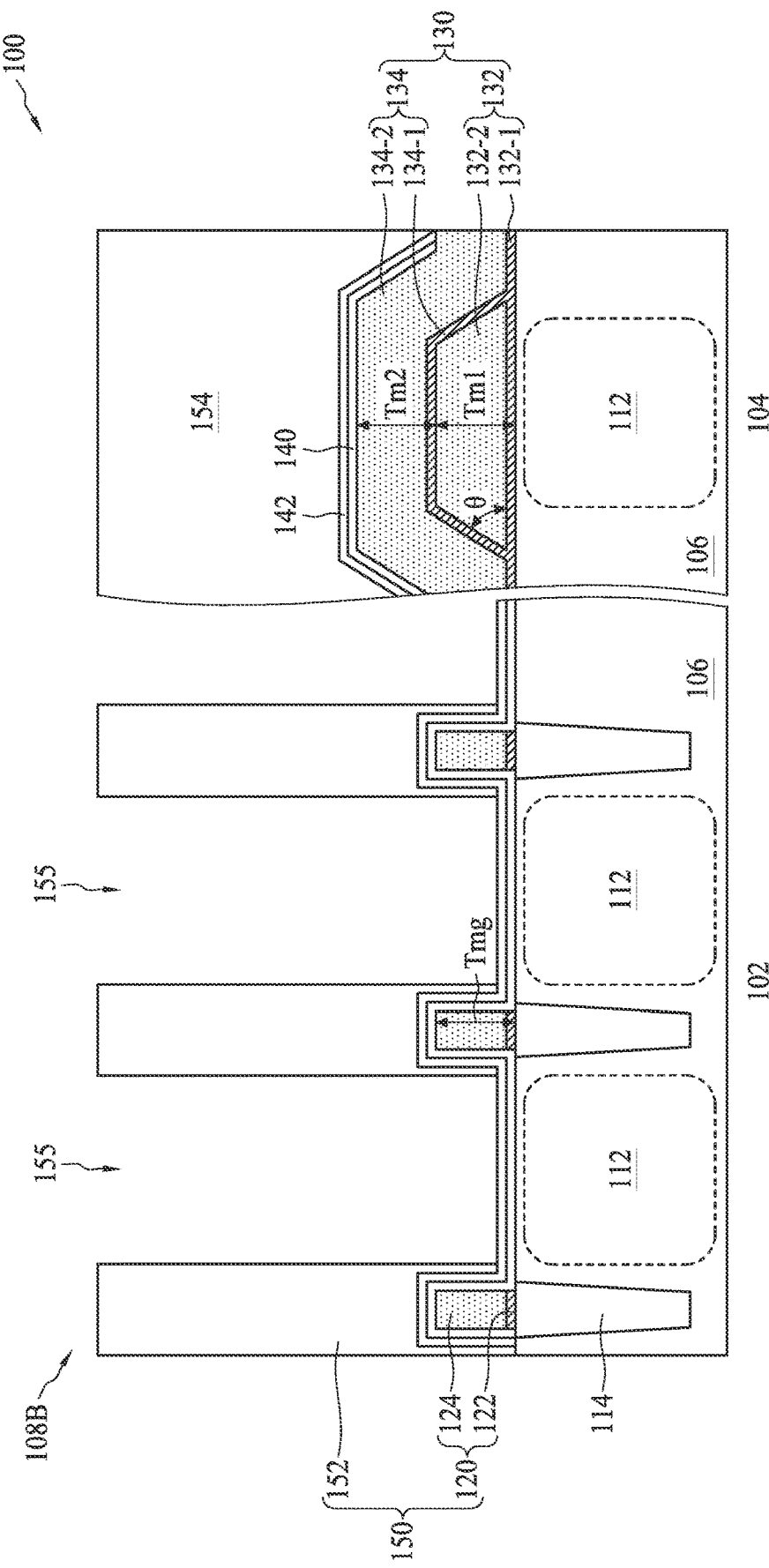

Referring to FIG. 5F, in some embodiments, a dielectric layer is formed over the substrate 106 on the back side 108B. In some embodiments, the dielectric layer may include silicon oxide, but the disclosure is not limited thereto. A thickness of the dielectric layer may be between approximately 5,000 angstroms and approximately 10,000 angstroms, but the disclosure is not limited thereto. Subsequently, the dielectric layer is patterned, thus forming a dielectric grid 152 over the metal grid 120 in the sensor region 102, and a dielectric stack 154 over the hybrid metal shield 130 in the BLC region 104. As shown in FIG. 5F, the dielectric grid 152 is aligned with and overlaps the metal grid 120. Further, a width of the dielectric grid 152 may be equal to or greater than a width of the metal grid 120. In some embodiments, the dielectric grid 152 and the metal grid 120 form a hybrid low-n grid 150. Further, a plurality of trenches 155 are formed by the forming of the hybrid low-n grid 150. As shown in FIG. 5F, the dielectric grid 152 serves as sidewalls of the trenches 155 and the protecting layer 142 serves as a bottom of the trenches 155.

Additionally, a top surface of the dielectric stack 154 in the BLC region 104 is aligned with (i.e., coplanar with) a top surface of the hybrid low-n grid 150 (i.e., a top surface of the dielectric grid 152) in the sensor region 102.

Figure 5G:
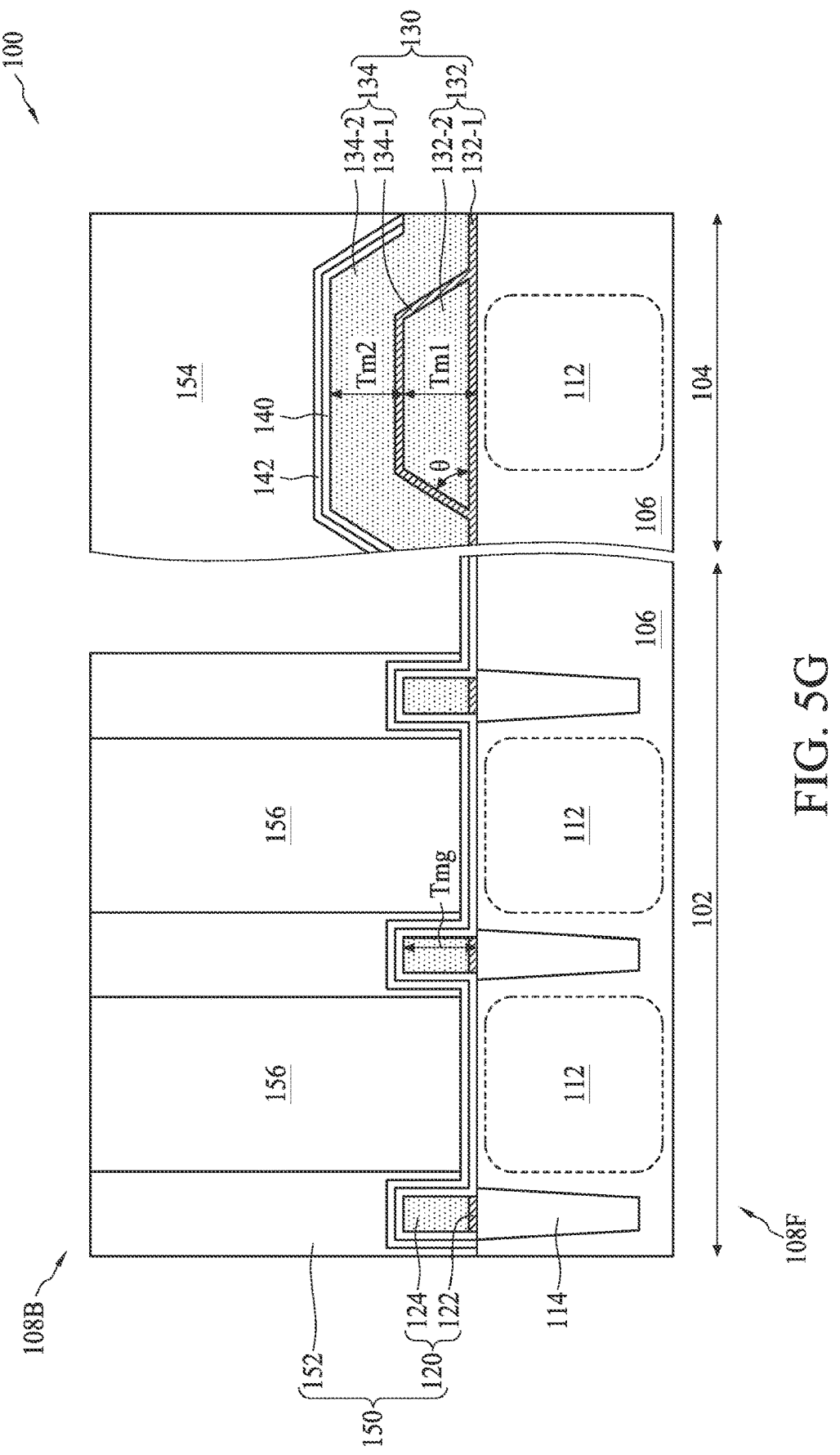

Referring to FIG. 5G, color filters 156 are formed to fill the trenches 155. Further, the color filters 156 are aligned with the photodiodes 112, respectively. The color filters 156 may have a refractive index that is less than a refractive index of the hybrid low-n grid 150. It will be appreciated that, due to the different refractive indices of the color filters 156 and the hybrid low-n grid 150, when light, such as photons, encounters an interface between the color filters 156 and the hybrid low-n grid 150, the light is reflected away from the hybrid low-n grid 150 and back into the color filters 156, such that the light is not directed toward an incorrect photodiode 112.

Figure 5H:
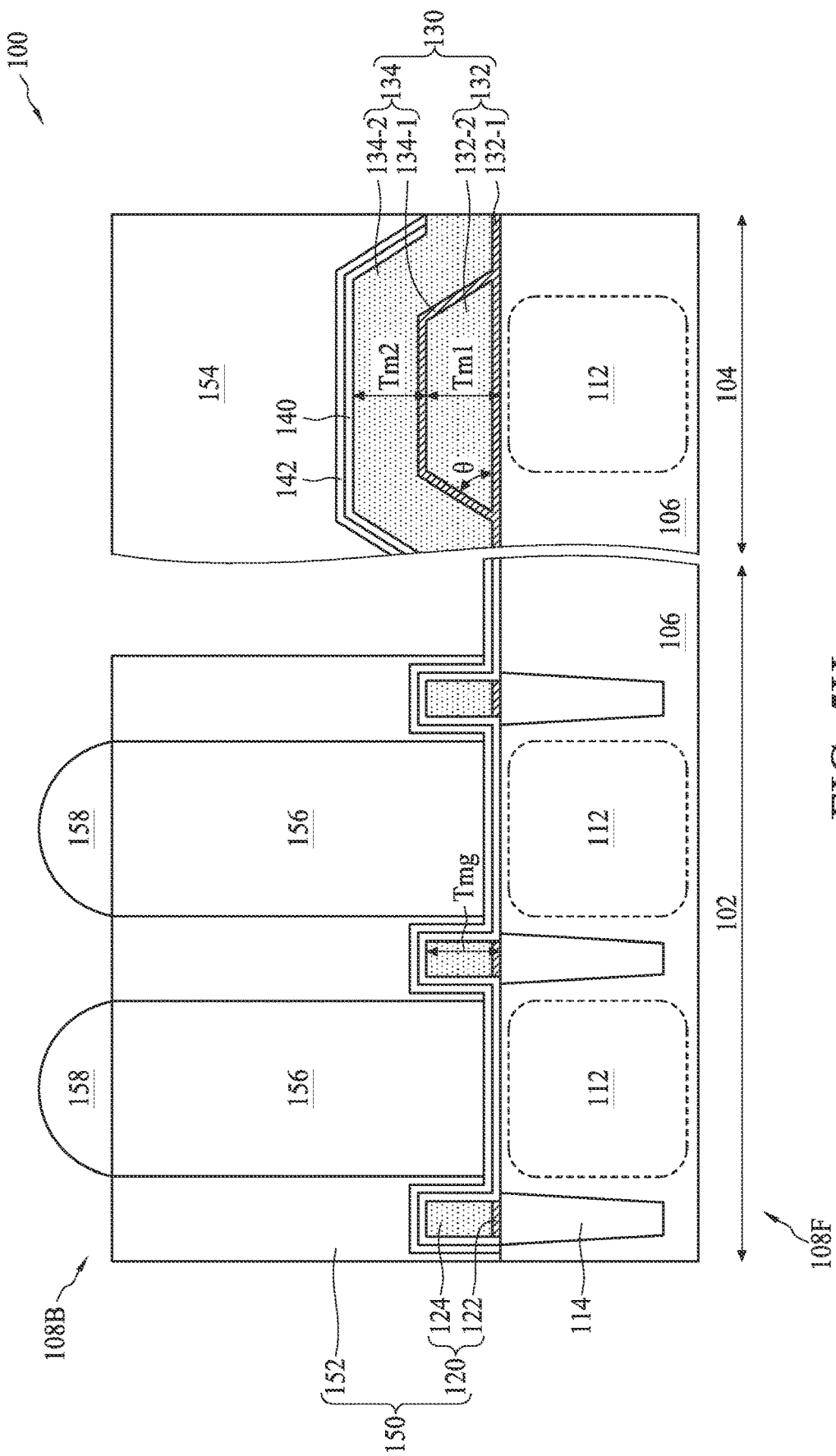

Referring to FIG. 5H, in some embodiments, micro-lenses 158 are formed over the color filters 156, respectively. The micro-lenses 158 are configured to focus light toward the photodiodes 112.

According to some embodiments of the present disclosure, the metal grid 120 and the hybrid metal shield 130 have different thicknesses. Thus, the hybrid metal shield 130 has sufficient thickness to block the light, while the metal grid 120 is relatively thin such that light intake is impervious.

Figure 6A:
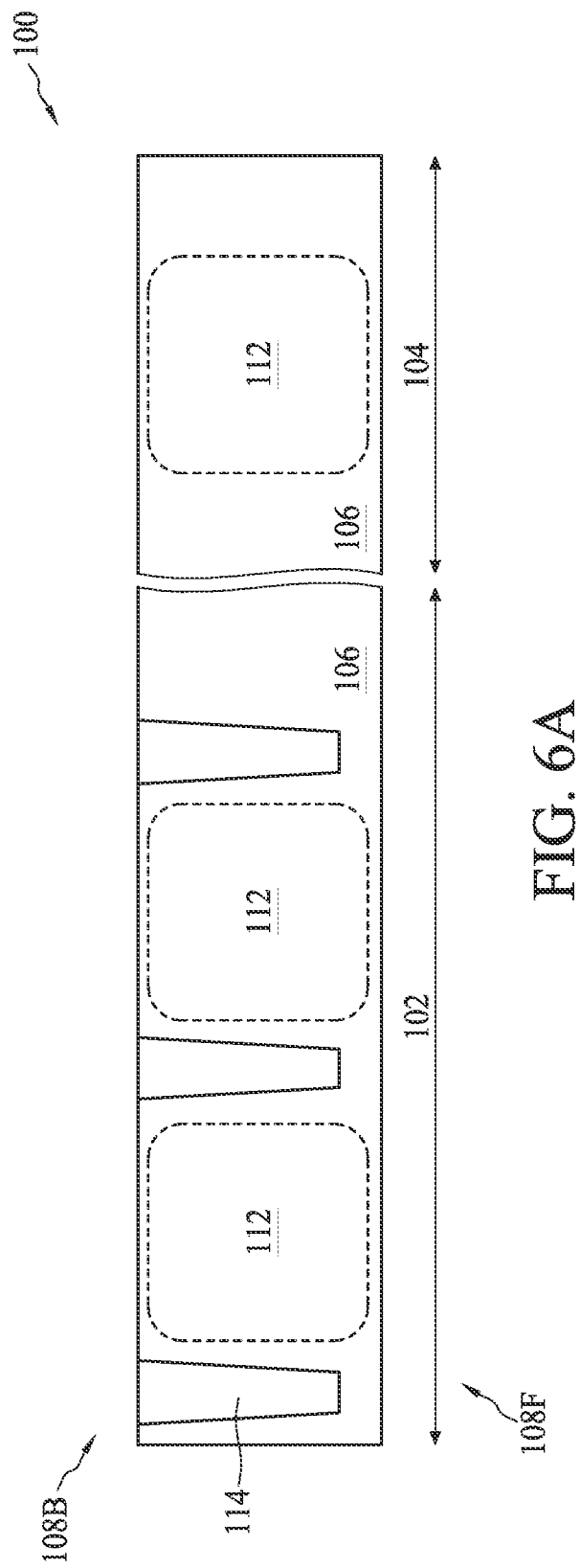
FIGS. 6A to 6F are schematic drawings illustrating a semiconductor image-sensing structure in various stages according to aspects of the present disclosure in one or more embodiments.
Figure 6B:
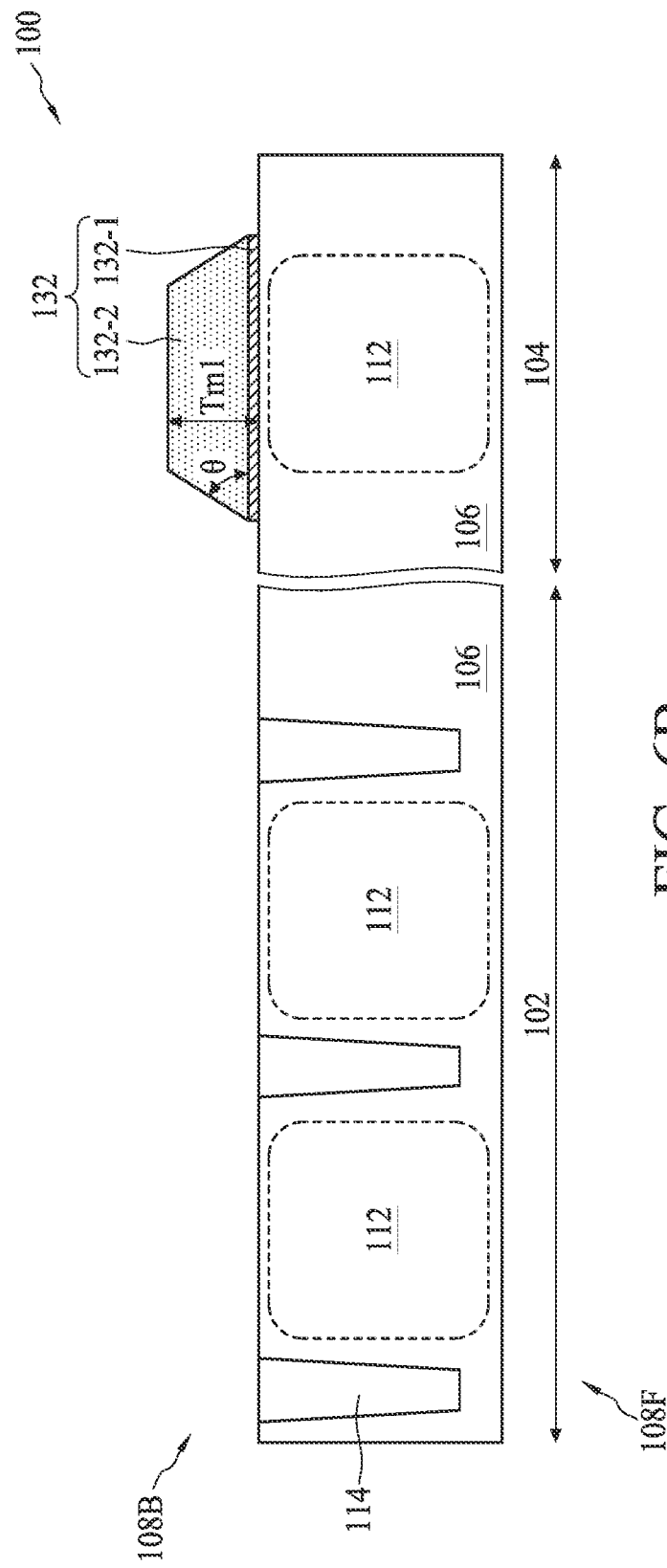
Figure 6C:
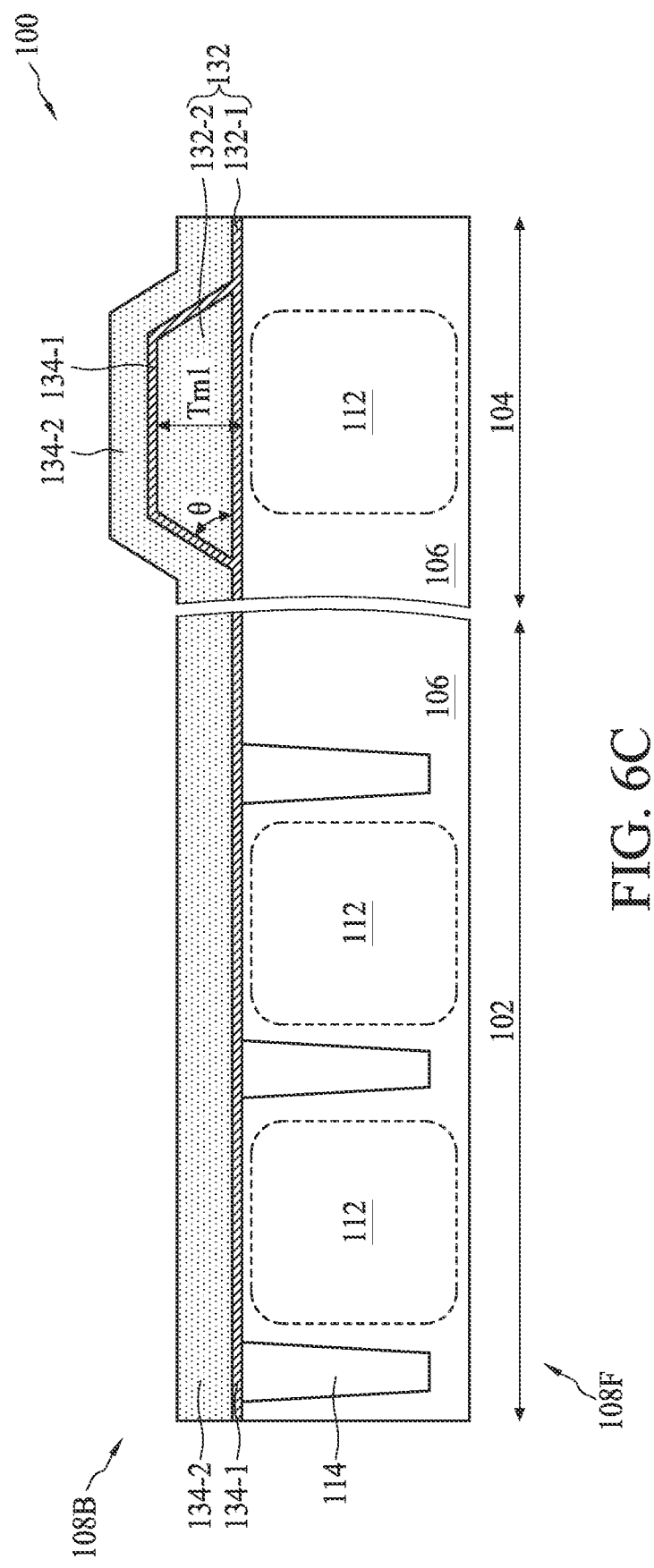
Figure 6D:
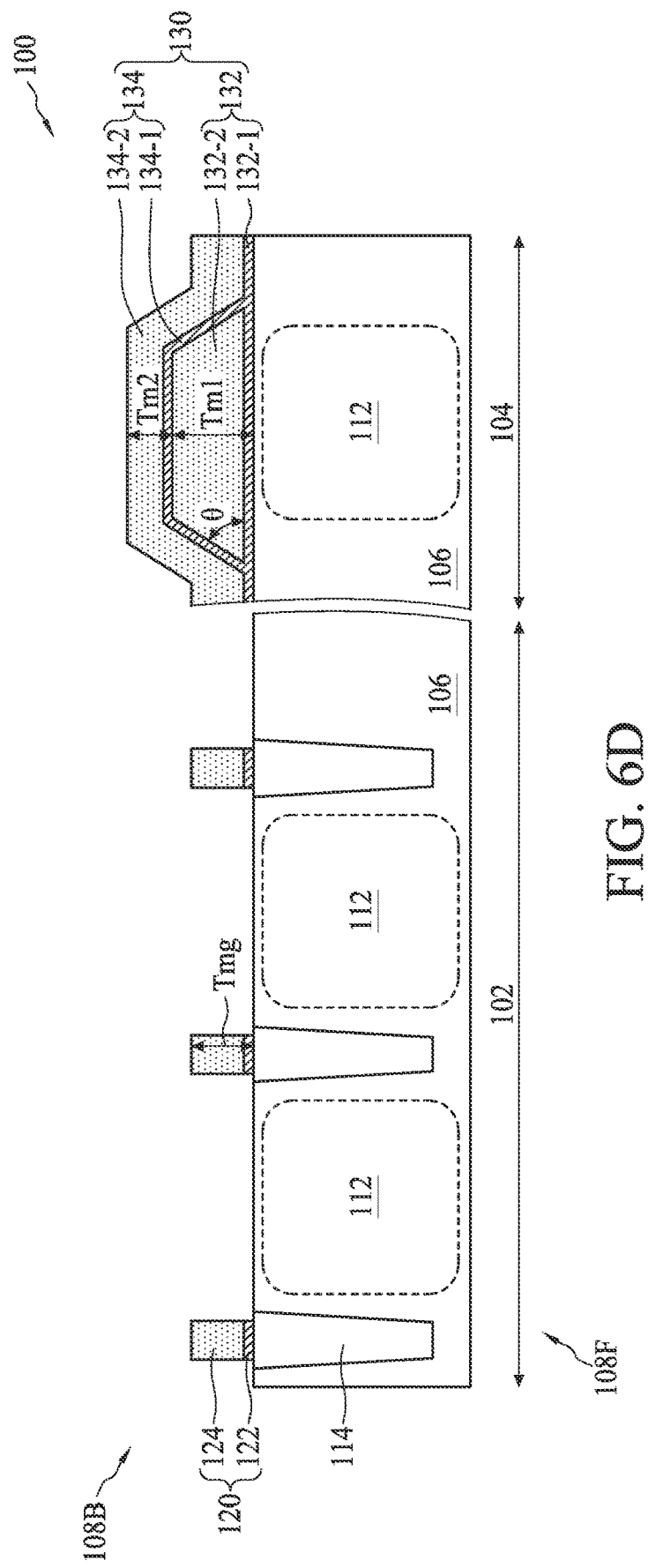
Figure 6E:
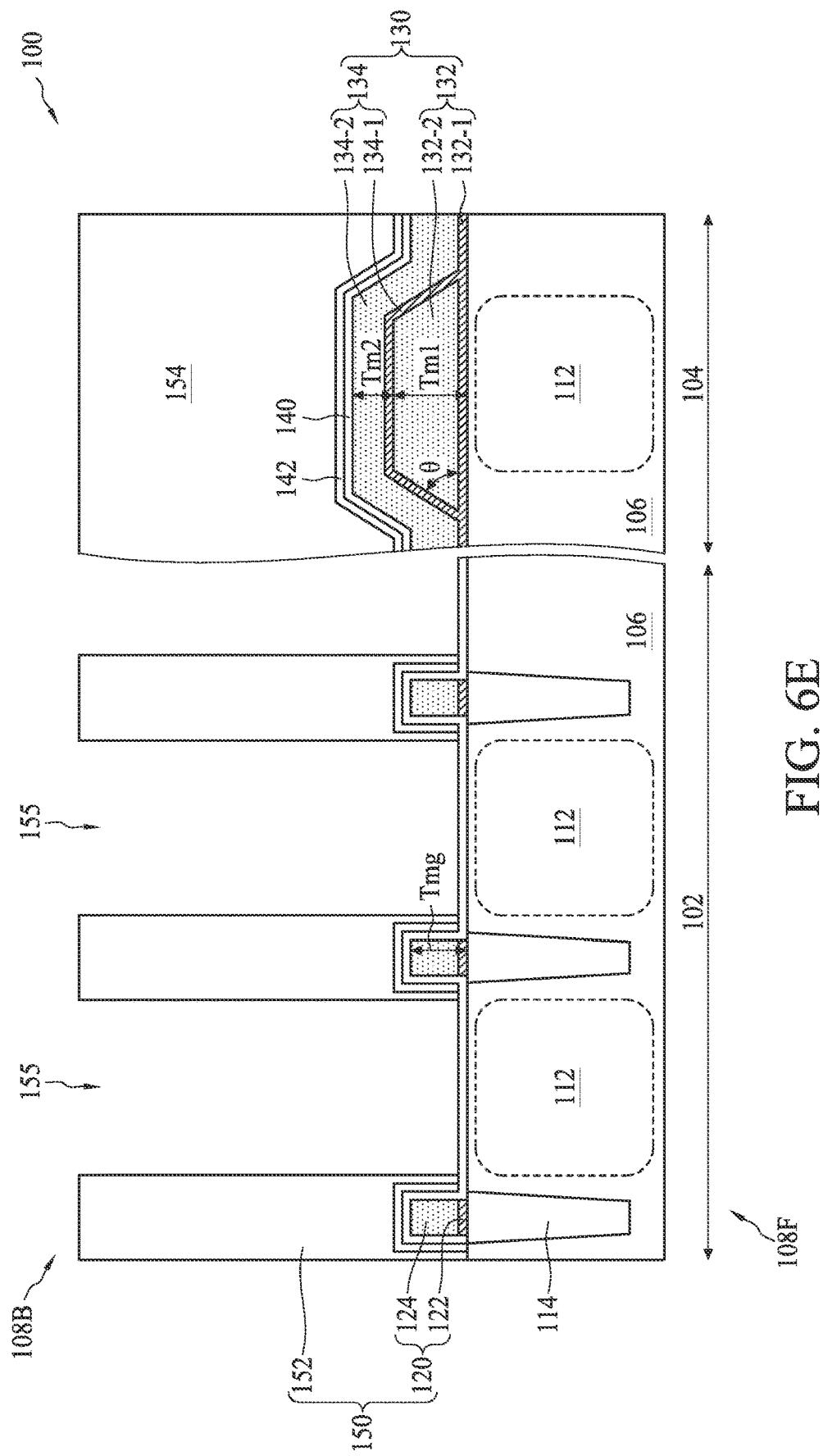
Figure 6F:
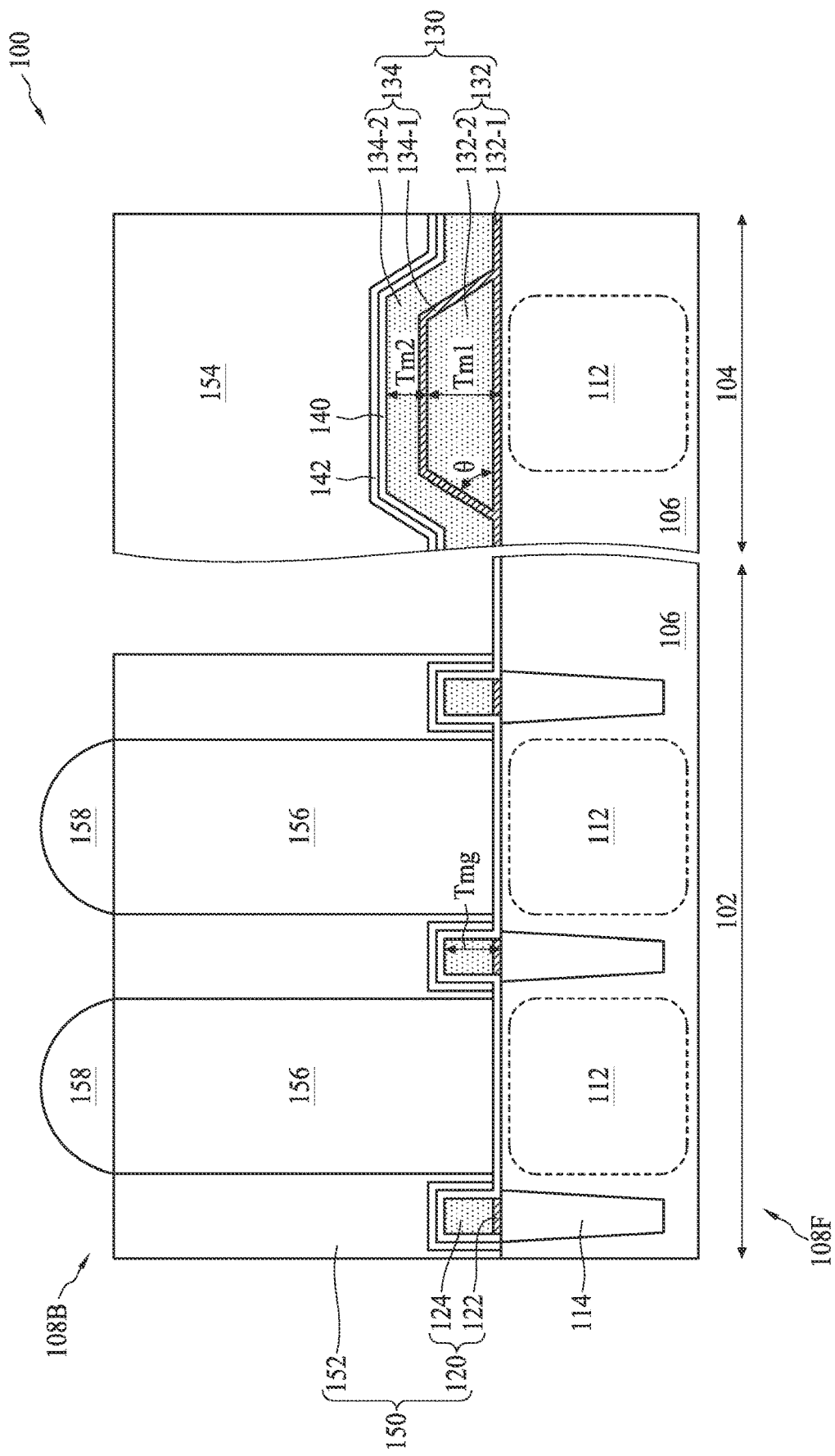

Please refer to FIGS. 6A to 6F, which are schematic drawings of a semiconductor image-sensing structure in various stages according to aspects of the present disclosure in one or more embodiments. It should be noted that the method 20 may be performed to form a semiconductor image-sensing structure 100 as shown in FIGS. 6A and 6F. It should be noted that details, such as materials, of same elements shown in FIGS. SA to SH and FIGS. 6A to 6F are omitted for brevity.

In operation 201, a substrate 106 is received. The substrate 106 has a front side 108F and a back side 108B opposite to the front side 108F. A sensor region 102 and a BLC region 104 are defined in the substrate 106. As mentioned above, FEOL operations. MEOL operations and BEOL operations may be performed to form doped regions, devices, conductive vias and interconnection structures, and details of such operations are omitted for brevity.

As mentioned above, in some embodiments, the substrate 106 is flipped over and thinned from the back side 108B. A plurality of isolation structures (i.e., DTI) 114 are formed in the substrate 106. Additionally, an anti-reflective coating (ARC) (not shown) may be formed over the surface of the substrate 106 on the back side 108B. In some embodiments, other suitable layers may be formed over the ARC; descriptions of such details is omitted for brevity.

Referring to FIG. 6B, in operation 202, a first metal stack 132 is formed over the substrate 106 on the back side 108B in the BLC region 104. The operation 202 includes further steps. As mentioned above, a first metallization layer 132-1 is formed over the substrate 106 on the back side 108B, and a second metallization layer 132-2 is formed over the first metallization layer 132-1. A thickness of the second metallization layer 132-2 is different from a thickness of the first metallization layer 132-1. In some embodiments, the thickness of the second metallization layer 132-2 is greater than the thickness of the first metallization layer 132-1. Subsequently, portions of the first metallization layer 132-1 and portions of the second metallization layer 132-2 are removed from the sensor region 102, and the first metal stack 132 is formed in the BLC region 104. In some embodiments, the first metal stack 132 has an included angle θ between approximately 40° and approximately 60°. In some embodiments, the sensor region 102 is free of the first and second metallization layers 132-1 and 132-2, as shown in FIG. 6B. As mentioned above, the second metallization layer 132-2 of the first metal stack 132 is a trapezoid, but the disclosure is not limited thereto. A thickness Tm1 of the first metal stack 132 is equal to a sum of the thickness of the first metallization layer 132-1 and the thickness of the second metallization layer 132-2.

In operation 203, a metal grid 120 is formed in the sensor region 102 and a second metal stack 134 is formed in the BLC region 104, simultaneously. The operation 203 includes further steps. For example, as shown in FIG. 6C, in some embodiments, a third metallization layer 134-1 is formed over the substrate 106 on the back side 108B. In some embodiments, the third metallization layer 134-1 includes a material same as that of the first metallization layer 132-1, but the disclosure is not limited thereto. As shown in FIG. 6C, the third metallization layer 134-1 covers the surface of the substrate 106 on the back side 108F and the first metal stack 132. In such embodiments, the second metallization layer 132-2 is sealed within the first and third metallization layers 132-1 and 134-1. The third metallization layer 134-1 provides adhesion between the substrate 106 and its overlying layer. In some embodiments, a thickness of the third metallization layer 134-1 may be similar to the thickness of the first metallization layer 132-1, but the disclosure is not limited thereto. For example, the thickness of the third metallization layer 134-1 may be less than the thickness of the first metallization layer 132-1, as shown in FIG. 6C.

Still referring to FIG. 6C, a fourth metallization layer 134-2 is formed over the third metallization layer 134-1. In some embodiments, the fourth metallization layer 134-2 includes a material same that of as the second metallization layer 132-2, but the disclosure is not limited thereto. A thickness of the fourth metallization layer 134-2 is different from the thickness of the third metallization layer 134-1. In some embodiments, the thickness of the fourth metallization layer 134-2 is greater than the thickness of the third metallization layer 134-1. Further, the thickness of the fourth metallization layer 134-2 is less than the thickness of the second metallization layer 132-2, as shown in FIG. 6C.

Referring to FIG. 6D, in some embodiments, portions of the third metallization layer 134-1 and portions of the fourth metallization layer 134-2 are removed from the sensor region 102 and the BLC region 104. Accordingly, the metal grid 120 is formed in the sensor region 102, and the second metal stack 134 is formed over the first metal stack 132 in the BLC region 104. In some embodiments, portions of the third and fourth metallization layers in the sensor region 102 serve as parts of the metal grid 120, and thus may be referred to as a fifth metallization layer 122 and a sixth metallization layer 124. The first metal stack 132 and the second metal stack 134 form a hybrid metal shield 130, as shown in FIG. 6D. A thickness Tm2 of the second metal stack 134 is equal to a sum of the thickness of the third metallization layer 134-1 and the thickness of the fourth metallization layer 134-2, and a thickness Tmg of the metal grid 120 is equal to a sum of the thickness of a fifth metallization layer 122 and a thickness of the sixth metallization layer 124. As shown in FIG. 6D, in some embodiments, the thickness of the second metallization layer 132-2 is greater than the thickness of the fourth metallization layer 134-2 and the thickness of the sixth metallization layer 124. In such embodiments, the thickness Tmg of the metal grid 120 is similar to the thickness Tm2 of the second metal stack 134. Further, the thickness Tmg of the metal grid 120 and the thickness Tm2 of the second metal stack 134 are both less than the thickness Tm1 of the first metal stack 132.

Referring to FIG. 6E, in some embodiments, protecting layers 140 and 142 may be formed over the substrate 106 on the back side 108B. Subsequently, referring to FIG. 6F, a dielectric layer is formed over the substrate 106 on the back side 108B and patterned, thus forming a dielectric grid 152 over the metal grid 120 in the sensor region 102 and forming a dielectric stack 154 is formed over the hybrid metal shield 120 in the BLC region 104. As shown in FIG. 6F, the dielectric grid 152 is aligned with and overlaps the metal grid 120. Further, a width of the dielectric grid 152 may be equal to or greater than a width of the metal grid 120. In some embodiments, the dielectric grid 152 and the metal grid 120 form a hybrid low-n grid 150. Additionally, a top surface of the dielectric stack 154 in the BLC region 104 is aligned with (i.e., coplanar with) a top surface of the hybrid low-n grid 150 (i.e., a top surface of the dielectric grid 152) in the sensor region 102. Further, a plurality of trenches 155 are defined by the forming of the hybrid low-n grid 150. As shown in FIG. 6E, the trench 155 has the dielectric grid 152 serves as sidewalls of the trenches 155 and the protecting layer 142 serves as bottoms of the trenches 155.

Referring to FIG. 6F, color filters 156 are formed to fill the trenches 155. Further, the color filters 156 are aligned with the photodiodes 112, respectively. The color filters 156 may have a refractive index that is less than a refractive index of the hybrid low-n grid 150. It will be appreciated that due to the different refractive indices of the color filters 156 and the hybrid low-n grid 150, when light, such as photons, encounters an interface between the color filters 156 and the hybrid low-n grid 150, the light is reflected away from the hybrid low-n grid 150 and back into the color filters 156, such that the light is not directed toward an incorrect photodiode 112. In some embodiments, micro-lenses 158 are formed over the color filters 156, respectively. The micro-lenses 158 are configured to focus light towards the photodiodes 112.

Figure 7:
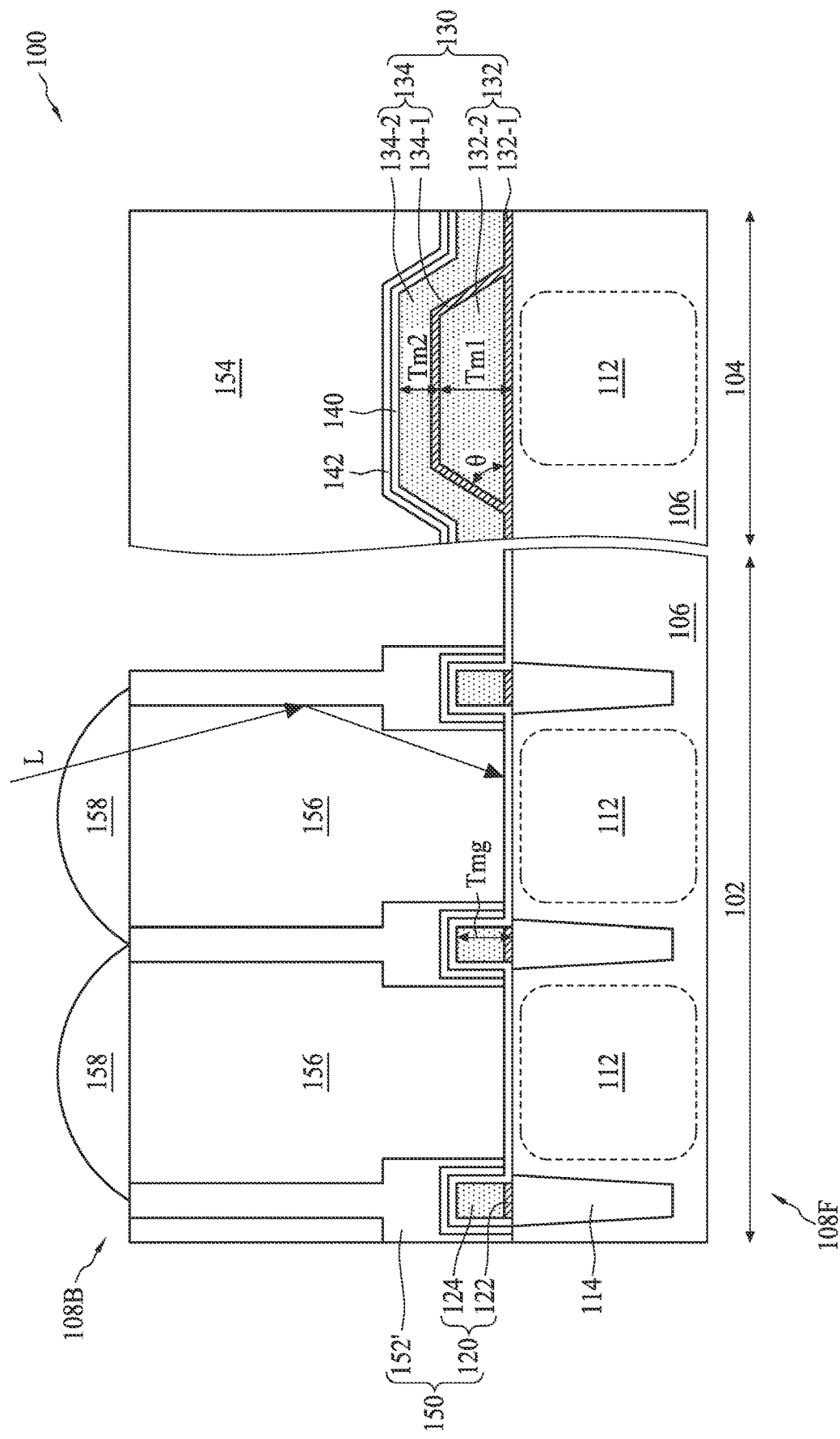
FIG. 7 is a cross-sectional view of a semiconductor image-sensing structure in accordance with some embodiments of the present disclosure.

FIG. 7 is a cross-sectional view of a semiconductor image-sensing structure 101 in accordance with some embodiments, of the present disclosure. It should be noted that semiconductor image-sensing structure 101 may be formed by the method as shown in FIGS. 5A to 5H or FIGS. 6A and 6F, but the disclosure is not limited thereto. It should be noted that same elements shown in FIGS. 2, 3 and 7 may designated by same numerals, and details, such as materials, of same elements shown in FIGS. 2, 3 and 7 are omitted for brevity.

As shown in FIG. 7, in some embodiments, the dielectric grid 152' of the hybrid low-n grid 150 may have bottle-shaped configuration. For example, a width of a lower portion of the dielectric grid 152' is greater than a width of an upper portion of the dielectric grid 152'. In such embodiments, a width of an upper portion of the color filter 156 is greater than a width of a lower portion of the color filter. In some embodiments, the metal grid is disposed in the lower portion of the dielectric grid 152', as shown in FIG. 7, but the disclosure is not limited thereto.

The present disclosure therefore provides the semiconductor image-sensing structure having the metal shield and the metal grid with different thicknesses or heights. In some embodiments, the thickness of the metal shield is greater than the thickness of the metal grid. In some embodiments, the metal shield may be a hybrid metal shield. According to the semiconductor image-sensing structure, light is efficiently blocked from the black reference image-sensing elements by the thick metal shield. Further, the light intake may be increased by the thin metal grid.

In some embodiments, a semiconductor image-sensing structure is provided. The semiconductor image-sensing structure includes a substrate having a first region and a second region, a metal grid in the first region, and a hybrid metal shield in the second region. The hybrid metal shield includes a first metallization layer, a second metallization layer disposed over the first metallization layer, a third metallization layer disposed over the second metallization layer, and a fourth metallization layer disposed over the third metallization layer. An included angle of the second metallization layer is between approximately 10° and approximately 80°.

In some embodiments, a semiconductor image-sensing structure is provided. The semiconductor image-sensing structure includes a substrate having a first region and a second region, a metal grid in the first region, and a hybrid metal shield in the second region. The hybrid metal shield includes a first metal stack and a second metal stack disposed over the first metal stack. A thickness of the metal grid is equal to or less than a thickness of the first metal stack.

In some embodiments, a method for forming a semiconductor image-sensing structure is provided. The method includes following operations. A substrate is received. The substrate has a first region and a second region. A first metal stack is formed over the substrate in the second region. The first metal stack has an included angle between approximately 10° and approximately 80°. A metal grid is formed in the first region and a second metal stack is formed in the second region, simultaneously. The first metal stack and the second metal stack form a hybrid metal shield.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure

The invention claimed is:

1. A semiconductor image-sensing structure, comprising:
a substrate having a first region and a second region;
a metal grid in the first region; and
a hybrid metal shield in the second region, wherein the hybrid metal shield comprises:
a first metallization layer:
a second metallization layer disposed over the first metallization layer:
a third metallization layer disposed over the second metallization layer; and
a fourth metallization layer disposed over the third metallization layer,
wherein an included angle of the second metallization layer is between approximately 10° and approximately 80°.

2. The semiconductor image-sensing structure of claim 1, wherein a thickness of the metal grid is less than a thickness of the hybrid metal shield.

3. The semiconductor image-sensing structure of claim 1, wherein the first metallization layer and the third metallization layer of the hybrid metal shield comprise a first material, and the second metallization layer and the fourth metallization layer of the hybrid metal shield comprise a second material different from the first material.

4. The semiconductor image-sensing structure of claim 1, wherein the metal grid comprises a fifth metallization layer and a sixth metallization layer, the fifth metallization layer of the metal grid and the third metallization layer of the hybrid metal shield comprise a same material, and the sixth metallization layer of the metal grid and the fourth metallization layer of the hybrid metal shield comprise a same material.

5. The semiconductor image-sensing structure of claim 4, wherein a thickness of the fifth metallization layer of the metal grid is similar to a thickness of the third metallization layer of the hybrid metal shield, and a thickness of the sixth metallization layer of the metal grid is similar to a thickness of the fourth metallization layer of the hybrid metal shield.

6. The semiconductor image-sensing structure of claim 1, wherein a sum of a thickness of the first metallization layer of the hybrid metal shield and a thickness of the second metallization layer of the hybrid metal shield is similar to a sum of a thickness of the third metallization layer of the hybrid metal shield and a thickness of the fourth metallization layer of the hybrid metal shield.

7. The semiconductor image-sensing structure of claim 1, wherein a sum of a thickness of the first metallization layer of the hybrid metal shield and a thickness of the second metallization layer of the hybrid metal shield is greater than a sum of a thickness of the third metallization layer of the hybrid metal shield and a thickness of the fourth metallization layer of the hybrid metal shield.

8. A semiconductor image-sensing structure, comprising:
   a substrate having a first region and a second region;
   a metal grid in the first region; and
   a hybrid metal shield in the second region, wherein the hybrid metal shield comprises:
      a first metal stack; and
      a second metal stack disposed over the first metal stack,
   wherein a thickness of the metal grid is equal to or less than a thickness of the first metal stack.

9. The semiconductor image-sensing structure of claim 8, wherein the first metal stack comprises a first metallization layer and a second metallization layer over the first metallization layer, and the second metal stack comprises a third metallization layer over the first metal stack and a fourth metallization layer over the third metallization layer.

10. The semiconductor image-sensing structure of claim 9, wherein the second metallization layer has an included angle, and the included angle is between approximately 40° and approximately 60°.

11. The semiconductor image-sensing structure of claim 9, wherein the first metallization layer of the first metal stack and the third metallization layer of the second metal stack comprise a first material, and the second metallization layer of the first metal stack and the fourth metallization layer of the second metal stack comprise a second material different from the first material.

12. The semiconductor image-sensing structure of claim 11, wherein the metal grid comprises a fifth metallization layer and a sixth metallization layer over the fifth metallization layer, the fifth metallization layer comprises the first material, and the sixth metallization layer comprises the second material.

13. The semiconductor image-sensing structure of claim 8, wherein the thickness of the metal grid is similar to a thickness of the second metal stack.

14. The semiconductor image-sensing structure of claim 8, wherein a thickness of the second metal stack is equal to or less than the thickness of the first metal stack.

15. A method for forming a semiconductor image-sensing structure, comprising:
   receiving a substrate having a first region and a second region defined thereon;
   forming a first metal stack over the substrate in the second region, wherein the first metal stack has an included angle between approximately 40° and approximately 60°; and
   simultaneously forming a metal grid in the first region and a second metal stack in the second region, wherein the first metal stack and the second metal stack form a hybrid metal shield.

16. The method of claim 15, wherein the forming of the first metal stack comprises:
   forming a first metallization layer over the substrate:
   forming a second metallization layer over the first metallization layer; and
   removing portions of the first metallization layer and portions of the second metallization layer from the first region to form the first metal stack in the second region,
   wherein the first metallization layer comprises a first material, the second metallization layer comprises a second material different from the first material, and a thickness of the first metallization layer is different from a thickness of the second metallization layer.

17. The method of claim 16, wherein the forming of the metal grid and the second metal stack comprises:
   forming a third metallization layer over the substrate and the first metal stack;
   forming a fourth metallization layer over the third metallization layer; and
   removing portions of the third metallization layer and portions of the fourth metallization layer to form the metal grid in the first region and the second metal stack in the second region,
   wherein the third metallization layer comprises the first material, the fourth metallization layer comprises the second material, and a thickness of the third metallization layer is different from a thickness of the fourth metallization layer.

18. The method of claim 15, wherein a thickness of the metal grid is similar to a thickness of the first metal stack.

19. The method of claim 15, further comprising:
   forming at least a protecting layer over the metal grid and the hybrid metal shield; and
   forming a dielectric grid over the metal grid to form a hybrid grid and a dielectric stack over the hybrid metal shield.

20. The method of claim 19, wherein a cross-sectional view of the dielectric grid has a bottle configuration.

* * * * *